United States Patent [19]

Wall

[11] Patent Number: 5,428,255
[45] Date of Patent: Jun. 27, 1995

[54] GATE ARRAY BASE CELL WITH MULTIPLE P-CHANNEL TRANSISTORS

[75] Inventor: Frederick G. Wall, Garland, Tex.

[73] Assignee: Texas Instruments Incorporated, Dallas, Tex.

[21] Appl. No.: 265,553

[22] Filed: Jun. 23, 1994

Related U.S. Application Data

[63] Continuation of Ser. No. 101,658, Aug. 4, 1993, abandoned, which is a continuation of Ser. No. 786,444, Nov. 1, 1991, abandoned.

[51] Int. Cl.6 ................. H03K 19/094; H03K 19/173
[52] U.S. Cl. ......................................... 326/41; 326/45
[58] Field of Search ............... 307/465, 465.1, 468, 307/469; 364/716; 357/45

[56] References Cited

U.S. PATENT DOCUMENTS

| | | | |
|---|---|---|---|
| 4,412,237 | 10/1983 | Matsummura et al. | 357/45 |
| 4,558,236 | 12/1985 | Barrows | 307/469 |
| 4,644,187 | 2/1987 | Haji | 307/468 |
| 4,692,783 | 9/1987 | Monma et al. | 357/45 |
| 4,745,305 | 5/1988 | Crafts | 307/469 |
| 4,745,307 | 5/1988 | Kitamara et al. | 307/468 |
| 5,055,716 | 10/1991 | El Gamel | 307/469 |
| 5,217,915 | 6/1993 | Hashimoto et al. | 437/48 |
| 5,289,021 | 2/1994 | El Camal | 257/206 |

Primary Examiner—Edward P. Westin
Assistant Examiner—Richard Roseen
Attorney, Agent, or Firm—Ira S. Matsil; James C. Kesterson; Richard L. Donaldson

[57] ABSTRACT

A gate array base cell (100) performs logic and memory cell functions and comprises a first P-channel transistor (M1) for performing logic functions and having a first predetermined transconductance area and a second P-channel transistor (M5) for performing memory cell functions and having a second predetermined transconductance area. The second transconductance area is smaller than said first predetermined transconductance area. The gate array base cell (100) has programmable connections to first P-channel transistor (M1) and second P-channel transistor (M5) for selectively performing memory cell functions and logic functions. The gate array base cell (100) may be connected to operate as a memory cell with logic functions or separately as a memory cell or a logic gate array, such as a two-input NAND gate (128).

6 Claims, 2 Drawing Sheets

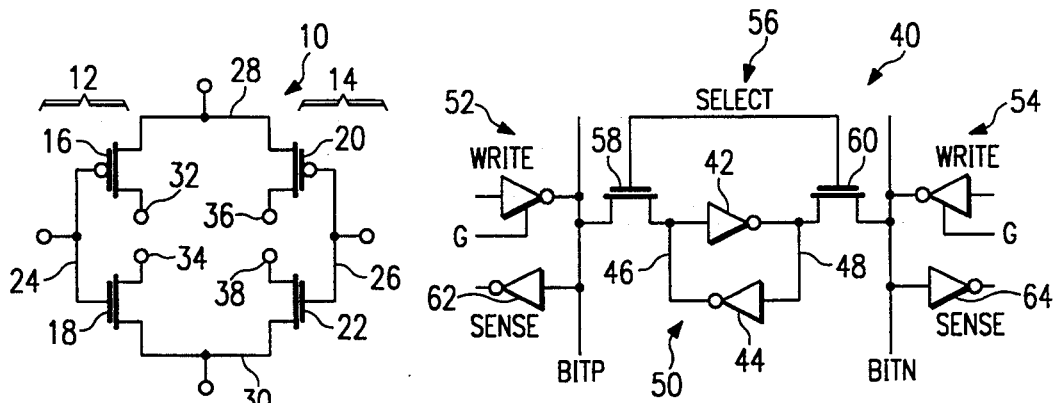
FIG. 1 (PRIOR ART)
FIG. 2 (PRIOR ART)
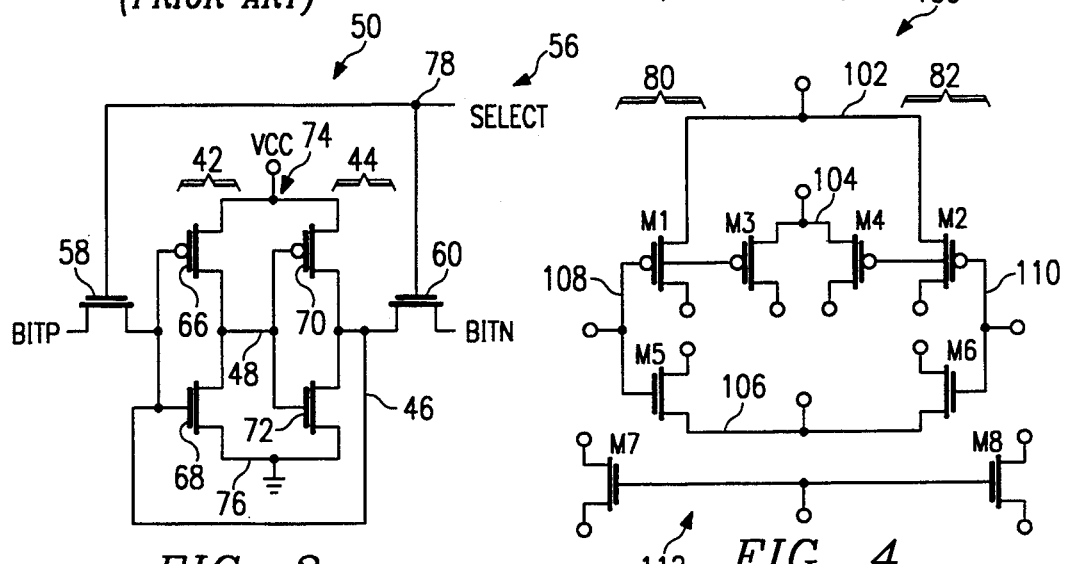
FIG. 3 (PRIOR ART)
FIG. 4
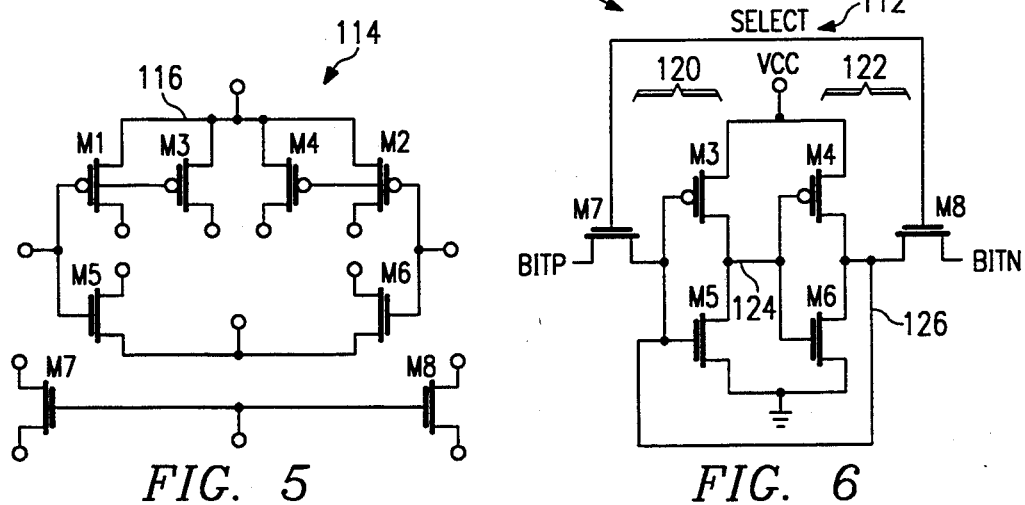
FIG. 5
FIG. 6

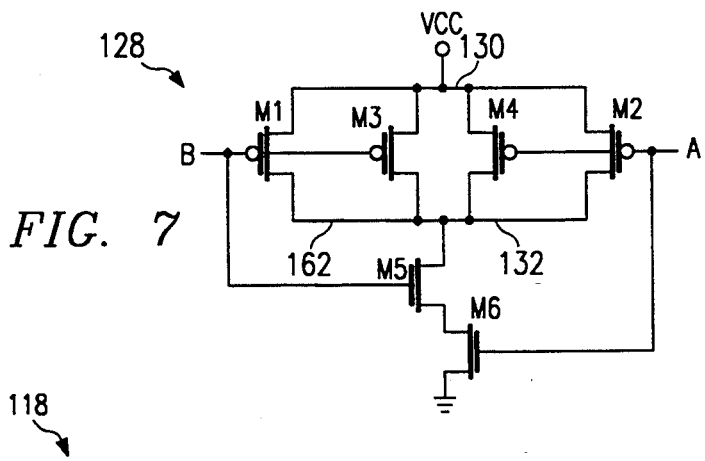
FIG. 7
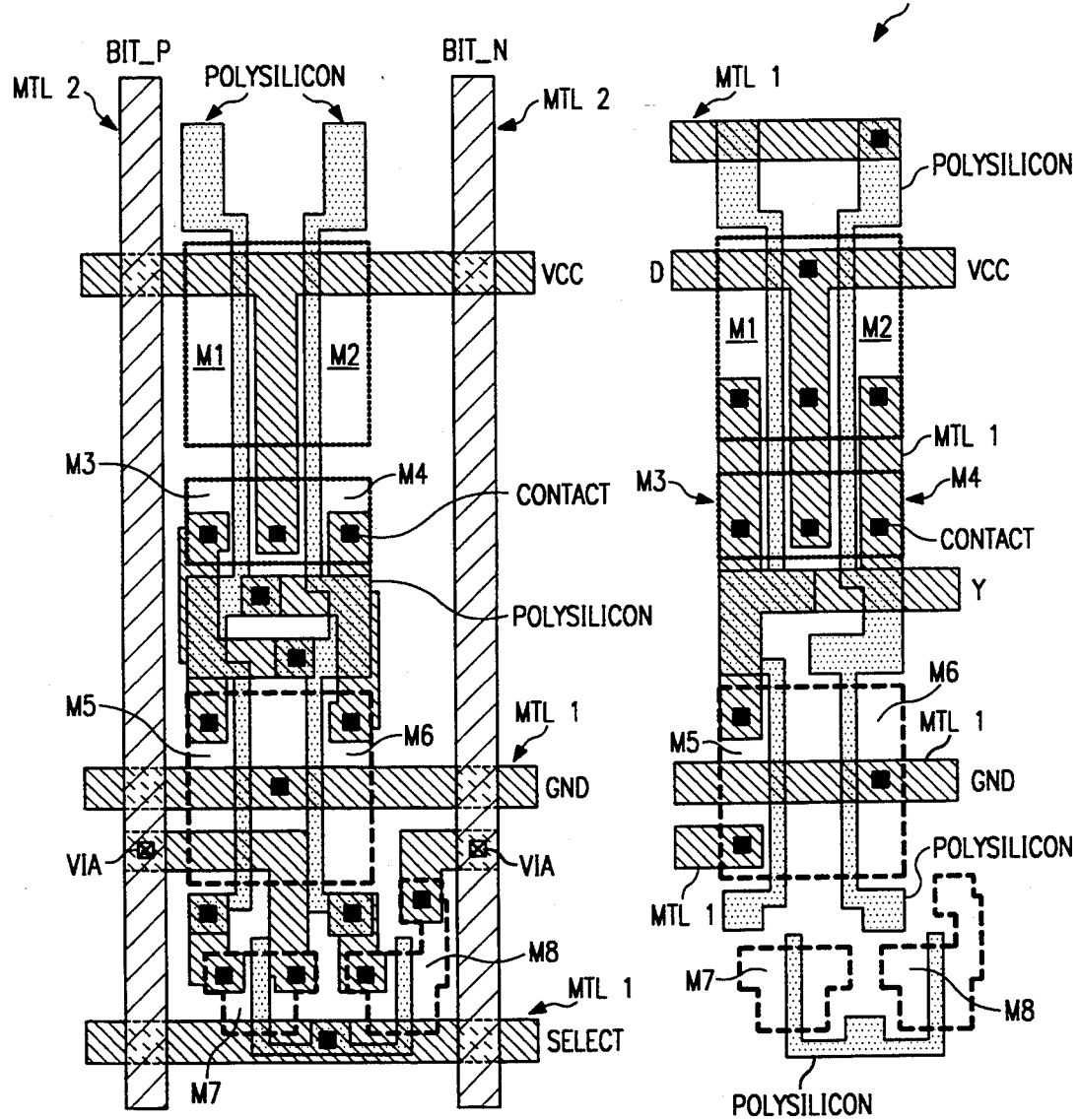
FIG. 8a
FIG. 8b

GATE ARRAY BASE CELL WITH MULTIPLE P-CHANNEL TRANSISTORS

This application is a continuation of application Ser. No. 08/101,658, filed Aug. 4, 1993, now abandoned, which is a continuation of Ser. No. 07/786,444, filed Nov. 1, 1991, now abandoned.

TECHNICAL FIELD OF THE INVENTION

The present invention relates to electronic circuit elements and more particularly to a gate array base cell having multiple P-channel transistors for performing memory cell functions and other implementations.

BACKGROUND INVENTION

In constructing a gate array, a semiconductor device is formed as a "base cell" comprising standardized segments of polysilicon configured to function as P-channel and N-channel transistors. The base cell is designed to make processing of a semiconductor device standard prior to the metalization level(s). With this design, it is possible to construct the semiconductor device simply by placing contacts, vias and metal leads at predetermined points on the prefabricated cell. This reduces costs in device fabrication by minimizing unique processing steps usually necessary for device fabrication. This type of process has significant economic benefits, because it permits the standardization of cell configurations and eliminates the need for specialized or uniquely designed gate array cells. Certain problems exist, however, when using a base cell for producing some semiconductor device functions. One significant limitation is that, because the gate array base cell is already designed on the semiconductor wafer, functional flexibility of these cells is minimal and often much less than that desired for particular applications.

Traditionally, in the design of a CMOS gate array, it has been recognized that the gate array performance is frequently less than that of specially designed devices. Recognizing this problem, gate array base cell designers may design an N-channel transistor and a P-channel transistor each having the same size and pre-determined routable connection points or targets on the polysilicon, N-moat, or P-moat layers that comprise the transistors. Thus, for one type of gate array formed from a base cell, the P-channel transistor and N-channel transistor have their gates connected together, but with no connection between their source/drains.

The typical gate array function is a two-input gate such as a NAND-gate and the typical base cell is designed as a two-stripe configuration. A stripe is a N-channel and P-channel transistor with a common gate of polysilicon. In the two-stripe configuration, the N-channel transistors share a common source/drain and the P-channel transistors share a common source/drain.

For a gate array, the size of the P-channel and N-channel portions of each stripe must be sufficiently large to permit a desired number of targets on the respective layers of polysilicon NMOT and PMOT for the placement of connects, vias, and metal to connect the various base cell portions. If the P-channel or N-channel is too small, an insufficient number of target points will exist to permit the routing of the metal leads for flexible interconnection of the gate array base cell for its intended application. One characteristic of P-channel transistors is that they produce less transconductance than the N-channel transistor for the same channel size. Thus, for the same transistor size, the N-channel transistor produces more current flow than does the P-channel transistor. This means that for the same size transistors driving a node, the P-channel transistor is slower to pull the voltage more positive than the N-channel is to pull the voltage low on a given node.

Some gate array base cell designs include designs for memory cells to perform memory functions within the base cell gate array. There are two known ways to achieve this result. First, it is possible to design the base cell gate array and then substitute, at desired points, memory cells capable of performing memory functions. This, in essence, results in a custom configuration of a gate array capable of performing memory functions. The most important limitation associated with this concept is its need for custom design and the expense associated with such design. Furthermore, it is even questionable whether there still exists a true gate array by definition of same using this technique.

Another known way to achieve the desired result of having a memory function on the base cell gate array is to design the memory cells in the base cell array as part of the standard design of the gate array. This design, however, also has significant drawbacks. When implementing a memory function in a CMOS base cell gate array, the simplest way of doing so is to use two inverters so connected that the output of each drives the input of the other. With this design, multiple memory cells are connected to sense/drive circuits be two complementary sense lines, one being labeled positive and the other negative. Each memory cell includes a select mechanism that permits the connection of only one memory cell to the sense/drive lines at a time. The best way to achieve this result is to design an N-channel transistor to connect the memory cell inverters to the sense lines.

In using the N-channel transistors to connect the memory cell inverters to the sense lines, an undesirable property of these transistors called "body effect" comes into play during a write cycle which limits the current transfer capability of the N-channel transistor. The larger the P-channel transistor, the larger must be the current drive required to write to it, therefore the larger must be the N-channel transistors used as select elements. However, the larger the N-channel select transistors, the larger the select drivers. Ultimately this tends to cause increased power dissipation and reduced circuit speeds.

For logic functions however, it is desired that the P-channel transistors exhibit equal transconductance to that of the N-channel transistors. But, polysilicon doped to perform in a P-channel transistor exhibits less transconductance per unit area than does an N-channel transistor. This necessarily means that the P-channel transistor must be larger than the N-channel transistor to achieve maximum performance.

Since all prior base cell configurations use a single P-channel transistor and a single N-channel transistor per stripe, it is not possible to adequately satisfy the needs of performing both the logic function and memory cell function with known base cells.

As a result, there is no known practical way to implement a memory function on a gate array base cell with generally acceptable speed, circuit density and reliability characteristics or any guarantee of manufacturability without reducing the size of the P-channel transistors. This results, however, in the limitation that the smaller P-channel transistors are undesirable for regular or normal standard logic functions that the base cell gate array performs. Basically, then, the memory function is the principal function of a gate array for which a small P-channel is desired. Most other functions require a large P-channel for proper operation.

Thus, there is a need for a gate array base cell that overcomes the limitations associated with existing base cell designs when the application for the base cell includes memory functions.

There is a need for a gate array base cell design that permits the economical design of gate arrays that provide memory functions.

There is a need for a gate array base cell design that permits the selectable use of the gate array for logic functions as well as memory functions.

SUMMARY OF THE INVENTION

Accordingly, the present invention provides a gate array base cell design with multiple P-channel transistors to facilitate memory cell implementation that overcomes the limitations and satisfies the needs previously stated.

According to the present invention, there is provided a gate array base cell having multiple P-channel transistors that comprises a first P-channel transistor for performing memory functions. The first P-channel transistor has a pre-determined size. The second P-channel transistor is designed to perform logic functions and it, too, has a pre-determined size. The size of the second P-channel transistor is larger than the size of the first P-channel transistor. The gate array base cell design further allows for selective connection of the first P-channel transistor so that the gate array performs a memory function and to engage either or both P-channel transistors to permit the gate array to perform other logic functions.

A technical advantage of the preferred embodiment is that, in a single gate array base cell, the present invention provides both a small P-channel transistor for memory functions and a larger P-channel transistor for all other functions that the gate array base cell typically performs.

Another technical advantage of the present invention is that the small P-channel transistor is designed for memory cell functions and may be utilized in simple logic functions such as to operate as a flip-flop or transfer gate. The larger P-channel transistor, however, may be used either separately or together with the smaller P-channel transistors to perform logic functions within the gate array base cell.

BRIEF DESCRIPTION OF THE DRAWINGS

The invention and its modes of use and advantages are best understood by reference to the following description of the illustrative embodiments, when read in conjunction with the accompanying drawings, wherein:

FIG. 1 provides a schematic diagram of a typical CMOS gate array two-stripe base call;

FIG. 2 provides a simplified circuit diagram for a typical gate array memory cell;

FIG. 3 shows a schematic diagram of a typical gate array memory cell;

FIG. 4 provides a schematic diagram of the preferred embodiment of the present invention;

FIG. 5 provides a schematic diagram of the preferred embodiment illustrating the application of a notched layout of P-channel transistors;

FIG. 6 provides a simplified schematic diagram of the preferred embodiment of the present invention used as a gate array memory cell;

FIG. 7 illustrates an application of the preferred embodiment as a two-input NAND gate array; and FIGS. 8a and 8b, respectfully, provide illustrative examples of sample base cell polysilicon, N-moat, P-moat and connect layouts of the preferred embodiment as a memory cell and a two-input NAND gate array.

DETAILED DESCRIPTION OF THE INVENTION

The preferred embodiment of the present invention is best understood by referring to the FIGURES wherein like numerals are used for like in corresponding parts of the various drawings.

FIG. 1 shows a typical CMOS gate array base cell 10 in which two stripes 12 and 14 each comprise a P-channel transistor and an N-channel transistor. For example, stripe 12 comprises P-channel transistor 16 and N-channel transistor 18, while stripe 14 comprises P-channel transistor 20 and N-channel transistor 22. For CMOS gate array base cell 10, P-channel transistor 16 and N-channel transistor 18 share polysilicon gate 24. Likewise, P-channel transistor 20 and N-channel transistor 22 share polysilicon gate 26. Line 28 shows the internal source/drain connection between P-channel transistors 16 and 20. Line 30 shows the internal source/drain connection between N-channel transistors 18 and 22.

P-channel transistor 16 connects to source/drain 32, N-channel transistor to source/drain 34, P-channel transistor 20 to source/drain 36, and N-channel transistor 22 to source/drain 38. In this configuration, usually the P-channel transistors have the same size as the N-channel transistors. As a result, there is no practical way to implement a memory function on a base cell with generally acceptable speed, component density, and reliability while at the same time performing logic functions with the P-transistor.

FIG. 2 shows a diagram of a typical gate array memory cell 40 in which the memory cell elements are designed from typical gate array base cell elements. In the base cell 40, the memory elements comprise inverters 42 and 44 that connect to one another by lines 46 and 48. In this configuration, inverter 42 drives inverter 44, and vice versa. Select mechanism 56 isolates memory cell 40 circuit 50 from bit lines BITP and BITN and write circuits 52 and 54. During a sense period, write circuits 52 and 54 must be tri-stated or effectively disconnected from bit lines BITP and BITN, respectively.

The typical select mechanism 56 for the preferred embodiment comprises N-channel transistors 58 and 60. N-channel transistors are desirable, because they have more transconductance per unit area. N-channel transistors 58 and 60, respectively, go to bit line BITP for sensing the logic state of inverter 44 and to bit line BITN for sensing the logic state of inverter 42. Sensing amplifiers 62 and 64 amplify the signal and isolate the sense lines from external circuitry.

Memory cell 40 must be capable of having its internal polarities changed to correspond to the polarities on bit lines BITP and BITN when it is selected by enabling N-channel transistors 58 and 60. During this write cycle, bit lines BITP and BITN are driven by write circuits 52 and 54 in such a way as to overpower whatever data may be in memory cell 40 to overwrite this data. During a write cycle, the N-channel of the write driver and the select N-channel are in series and must be able to sink enough current from the P-channel to guarantee the voltage of inverters 42 or 44, as appropriate, to less than 0.33 of the applied voltage. At this point, the body effect of transistors lowers the select N-channel transistors effective transconductance. This makes a P-channel in the memory cell with a small width very desirable, because a small P-channel transistor overcomes body effect problems in the select transistor.

Write drivers or circuits 52 and 54 may be any devices capable of sending a write signal to respective bit lines BITP and BITN. However, write circuits 52 and 54 must each have an enable signal G. The function of each enable signal G is to permit driving bit lines BITP and BITN when a write function is desired. When reading is to occur, on the other hand, it is necessary to tri-state circuit 52 and 54 to prevent them from overpowering the data coming from memory circuit 50, to sensing circuit amplifiers 62 and 64.

FIG. 3, shows memory cell circuit 50 at the transistor level to more fully describe the known memory cell 40 configuration. According to FIG. 3, inverter 42 comprises P-channel transistor 66 and N-channel transistor 68 while inverter 44 comprises P-channel transistor 70 and N-channel transistor 72. Source connections for P-channel transistors 66 and 70 go to $V_{cc}$ line 74, while the drain for transistor 66 goes to line 48, and the drain for transistor 70 goes to line 46. Likewise, source connections for N-channel transistors 68 and 72 go to ground line 76, the drain for transistor 68 goes to line 48 and the drain for transistor 72 goes to line 46. Select mechanism 56, comprising N-channel transistors 58 and 60, respectively, connect to inverters 42 and 44. N-channel transistor 58 of select mechanism 56 connects to bit line BITP and N-channel transistor 60 connects to bit line BITN. The gates of select N-channel transistors 58 and 60 both tie to select node 78.

FIG. 4 schematically illustrates gate array base cell 100 which is the preferred embodiment of the present invention. Gate array base cell 100 has two sets of transistors with a common or connected together gates. One set is comprised of large P-channel transistor M1, small P-channel transistor M3, and N-channel transistor M5. The other set is comprised of large P-channel transistor M2, small P-channel transistor M4, and N-channel transistor M6.

Large P-channel transistor M1 and small P-channel transistor M3 may be configured in a single stripe 80 with N-channel transistor M5. Likewise, large P-channel transistor M2 and small P-channel transistor M4 may be configured in a single stripe 82 with N-channel transistor M6. Select mechanism 154 includes N-channel transistors M7 and M8. This is the configuration of the gate array base cell prior to connecting the elements to perform memory, logic or other functions.

When gate array base cell 100 is to perform a memory function, only the small P-channel transistors M3 and M4 need be programmed in. On the other hand, when a logic or other normal cell function is desired, either the larger P-channel transistors M1 and M2 or the larger P-channel transistors M1 and M2 and the smaller P-channel transistors M3 and M4 may be connected together.

In the preferred embodiment, P-channel transistors M1 and M2 share common line 102, N-channel transistors M3 and M4 share common source line 104 and N-channel transistors M5 and M6 share common line 106. Additionally, P-channel transistors M1 and M3 share polysilicon gate 108, while P-channel transistors M2 and M4 share polysilicon gate 110. With this configuration, the interconnection of the transistor nodes determines the function of the gate array base cell as a memory cell or as a normal logic gate array base cell.

Select mechanism 112 is located in the same gate array base cell as memory cell 100, instead of an adjacent base cell. This has increased economy and versatility within a single gate array base cell. Additionally, this provides much more efficient programmation of the gate array base cell for the preferred embodiment. Thus, with the use of a minimal amount of additional wiring, select mechanism 112 can increase the circuit efficiency of memory cell 100.

There are at least two attractive implementations of the gate array base cell of the preferred embodiment. FIG. 5 shows the base cell 114 schematic in a "notched" layout configuration for P-channel transistors M1, M2, M3, and M4. For some purposes, the design may be such that the P-channel transistors are built with a layout notch. FIG. 5 shows that it is possible to configure P-channel transistors M1, M2, M3, and M4 so that they connect to source line 116. Transistors M1 and M3 are physically separate as are transistors M2 and M4. In this configuration, however, upon connecting any one of transistors M1, M2, M3, or M4 to $V_{cc}$, all transistors become electrically connected to $V_{cc}$. This configuration can save routing resources in the configuration of the gate array base cell 114.

This benefit may also operate disadvantageously, however, because all P-channel transistors are connected to $V_{cc}$ and even if not all transistors are used, there is a parasitic capacitance that the non-used P-channel transistors cause. Additionally, if a clad or low resistance moat is used, this scheme works well. On the other hand, if non-clad or high resistance moat is used, a significant resistance arises in the leads connecting to $V_{cc}$. This limits the drive currents for gate array 114.

FIG. 6 shows the gate array base cell used as a memory cell circuit 118. Memory cell circuit 118 may be used for memory cell functions such as described in association with FIG. 2 above. According to FIG. 6, smaller P-channel transistors M3 and M4 operate with N-channel transistors M5 and M6. P-channel transistor M3 and N-channel transistor M5 may form inverter 120 while P-channel transistor M4 and N-channel transistor M8 form inverter 122. Inverter 120 drives inverter 122 through lead 124. Likewise, inverter 122 drives inverter 120 through lead 126. Select mechanism 112 uses N-channel transistors M7 and M8 to reach bit lines BITP and BITN, respectively. FIG. 6 does not show large P-channel transistors M1 and M2. They, however, are nonetheless fabricated as part of the gate array base cell. They are not shown schematically, because they are not connected electrically. Additionally, larger P-channel transistors M1 and M2 are connected to the same strip of polysilicon and produce minimal parasitic capacitance.

FIG. 7 shows the gate array base cell of the preferred embodiment in the configuration of two-input NAND gate array 128. For the configuration of FIG. 7, P-channel transistors M1, M2, M3, and M4 connect through common source line 130 to $V_{cc}$ and have common drain line 132. Also connecting to common drain line 162 is N-channel transistor M5. For the two-input NAND function of the preferred embodiment, the source of N-channel transistor M5 goes to N-channel transistor M6. Enable signals for P-channel transistor M1 and M3 and N-channel transistor come from line B, while enable signals for P-channel transistor M2 and M4 and N-channel transistor M6 come from line A. Drain current from N-channel transistor M6 goes to ground. The output of NAND gate 128 is taken at node 132.

For the two implementations of the preferred embodiment that FIGS. 6 and 7 illustrate diagrammatically, FIGS. 8*a* and 8*b*, respectively, show simplified mask prints 134 and 136. In particular, FIG. 8*a* shows contacts, vias, and metal lines for the use of the preferred embodiment in a memory cell 118, while FIG. 8*b* shows the contacts, vias, and metal lines necessary for the preferred embodiment to serve as a two-input NAND gate array. The reference numbers for FIGS. 8*a* and 8*b* compared to the respective components for the preferred embodiment to operate, respectively, as a memory cell 118 and two-input NAND gate 128.

Although the invention has been described with reference to the above specified embodiments, this description is not meant to be construed in a limiting sense. Various modifications of the disclosed embodiment, as well as alternative embodiments of the invention will become apparent to person skilled in the art upon reference to the above description. It is therefore contemplated that the appended claims will cover such modifications that fall within the true scope of the invention.

What is claimed is:

1. A gate array base cell, comprising:
a first p-moat region including first, second, and third p-regions, wherein said first and second p-regions comprise the source and drain of a first p-channel transistor and wherein said second and third p-regions comprise the source and drain of a second p-channel transistor;
a second p-moat region including fourth, fifth and sixth p-regions, wherein said fourth and fifth p-regions comprise the source and drain of a third p-channel transistor and wherein said fifth and sixth p-regions comprise the source and drain of a fourth p-channel transistor;
a n-moat including first and second n-channel transistors formed therein;
wherein said first p-channel, said third p-channel and said first n-channel transistors include a first gate and wherein said second p-channel, said fourth p-channel and said second n-channel transistors include a second gate.

2. The cell of claim 1 wherein:
said first and second p-channel transistors have a first predetermined transconductance area; and
said third and fourth p-channel transistors have a second predetermined transconductance area, said second predetermined transconductance area being smaller than said first predetermined transconductance.

3. The cell of claim 1 wherein said first and second n-channel transistors each include a common source/drain region.

4. The cell of claim 1 wherein:
said third p-channel transistor and said first n-channel transistor are coupled to form a first inverter; and
said fourth p-channel transistor and said second n-channel transistor are coupled to form a second inverter.

5. The cell of claim 4 wherein:
said first inverter further includes said first p-channel transistor coupled in parallel with said third p-channel transistor.

6. The cell of claim 1 wherein said first and second gates comprise polysilicon gates.

* * * * *